United States Patent [19]

Morikawa

[11] Patent Number: 4,489,391
[45] Date of Patent: Dec. 18, 1984

[54] DIGITAL FILTER APPARATUS HAVING A RESONANCE CHARACTERISTIC

[75] Inventor: Shigenori Morikawa, Tokyo, Japan
[73] Assignee: Casio Computer Co., Ltd., Tokyo, Japan
[21] Appl. No.: 349,682
[22] Filed: Feb. 17, 1982

[30] Foreign Application Priority Data

Feb. 26, 1981 [JP] Japan .................. 56-27912

[51] Int. Cl.³ .......................................... G06F 7/38
[52] U.S. Cl. ................................ 364/724; 364/725
[58] Field of Search .......... 364/724, 725, 726, 727, 364/736, 200, 900

[56] References Cited

U.S. PATENT DOCUMENTS 3,706,076 12/1972 Schuster .................. 364/724
4,146,931 3/1979 Delforge .................. 364/724

OTHER PUBLICATIONS

Gabel, R. A., "A Parallel Arithmetic Hardware Structure for Recursive Digital Filtering, IEEE Trans. Acoustic, Speech, Signal Processing, ASSP-22 (4), 255-258 (1974).
Rader, C. M., "Digital Filter Design Techniques in the Frequency Domain", Proceedings of the IEEE, vol. 55, No. 2, Feb. 1967.
Esteban et al., "Microprogrammed Digital Filter", IBM Technical Disclosure Bulletin, vol. 18, No. 10, Mar. 1976.
Anderson, A. T., "Programable Digital Filter Performs Multiple Functions", Electronic Communications, pp. 78-84, Oct. 26, 1970.

Primary Examiner—Jerry Smith
Assistant Examiner—Michael R. Fleming
Attorney, Agent, or Firm—Frishauf, Holtz, Goodman & Woodward

[57] ABSTRACT

A resonance characteristic control unit is provided with a first memory for storing first data corresponding to poles of a digital filter under a non-resonance condition, and a second memory for storing second data corresponding to poles of the filter under maximum resonance amplitude condition. The data stored in these memories are read out to calculate a filter coefficient corresponding to the resonance amplitude. The calculated resultant data is supplied to the digital filter to obtain a filtered output which is provided with a desired resonance characteristic.

7 Claims, 7 Drawing Figures

DIGITAL FILTER APPARATUS HAVING A RESONANCE CHARACTERISTIC

BACKGROUND OF THE INVENTION

The present invention relates to a digital filter apparatus having a resonance characteristic.

As an alternative to an analog filter incorporating a transistor, a resistor, a capacitor, a coil and an operational amplifier, digital filters incorporating a digital circuit such as a multiplier, an adder, or a delay circuit have recently received much attention. Such a digital filter is used, for example, as a tone color setting circuit in an electronic musical instrument. These digital filters may be, for example, low-pass filters, high-pass filters and band-pass filters. For example, some analog type music synthesizers incorporate an analog filter having a resonance characteristic in order to add special tone color to the sound. When an analog filter having a resonance characteristic is used, a peak is generated in the amplitude of the musical sound signal and a musical sound is obtained which has a special tone color in which this frequency component having the peak is emphasized. Although it is possible to construct a digital filter having such a resonance characteristic, a ROM of large capacity as an element of the digital filter is generally necessary, resulting in a disadvantage. This will be described in more detail.

For designing a filter, a transfer function must first be obtained. A method is known for designing a digital filter according to which a transfer function H(S) of an analog filter is first obtained, and then it undergoes the standard Z-transform, the bilinear Z-transform, or the alignment Z-transform to obtain a transfer function H(Z) of the desired digital filter.

An example of an analog low-pass filter of a second-order will be described. A transfer function H(S) of the second-order low-pass filter is generally expressed by $$H1(S) = 1 / \left( S^2 + \frac{\sqrt{2}}{Q} S + 1 \right) \quad (1)$$

FIG. 1 shows the unit circle on the S-plane and the poles as represented by equation (1). When Q=1, the poles may be expressed as $$Z = -\frac{1}{\sqrt{2}} \pm j \frac{1}{\sqrt{2}} \quad (2)$$

which are indicated by P1, P2 in the figure. In the equation (1), Q is the amplitude of resonance and is usually 1 under the normal non-resonance condition.

For realizing a resonance characteristic, the poles are moved along the unit circle to the imaginary axis as indicated by arrows in FIG. 1. In this case, a peak is generated in the amplitude characteristic at the position $\omega = \omega 0$ (resonance angular frequency) as shown in FIG. 2.

A digital filter apparatus having such a resonance characteristic has been described in a U.S. patent application (Ser. No. 279,630, filed on July 1, 1981). In this application, the apparatus can be realized by merely adding relatively simple circuitry having a memory of small capacity. In the respective embodiments described in this application, the resonance characteristic has been realized by moving the poles on the Z-plane parallel to the imaginary axis as shown in FIG. 3 to approach the unit circle. However, when the poles are moved parallel to the imaginary axis, the cutoff frequency is increased as the amplitude of resonance becomes larger (or decreased when the poles are in the left half-plane). FIG. 4 shows this case, wherein the cutoff frequency is plotted as the abscissa and the gain is plotted as the ordinate. Therefore, there are cases where it is difficult to obtain the resonance characteristic at the desired value of the cutoff frequency. Further, for achieving the resonance characteristic in the low frequency region, a considerably larger number of operation bits is required.

SUMMARY OF THE INVENTION

It is an object of the present invention to provide a digital filter apparatus which is capable of realizing an excellent resonance characteristic without varying the cutoff frequency.

According to the present invention, there is provided a digital filter apparatus which comprises a first memory for storing a first data corresponding to poles of a filter, a second memory for storing a second data corresponding to poles of the filter under the maximum resonance amplitude condition, and arithmetic means for calculating a filter coefficient corresponding to resonance amplitude from the contents read out from the first and the second memories, wherein the filter coefficient calculated by the arithmetic means is used in the filter for adding a resonance characteristic thereto.

DETAILED DESCRIPTION OF THE PREFERRED EMBODIMENT

Figure 1:
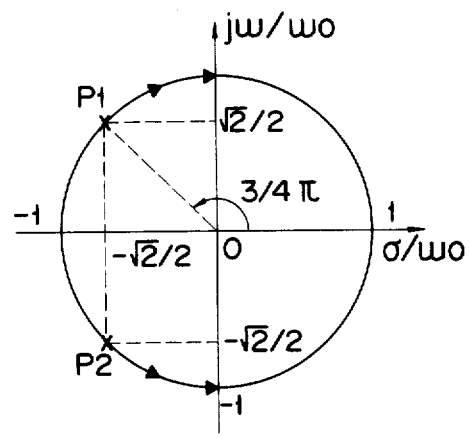
FIG. 1 is a view showing the poles of a second-order standard low-pass filter.
Figure 3:
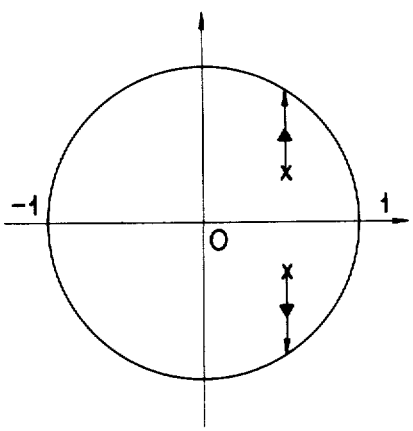
FIG. 3 is a view showing the movement of poles of a digital filter.
Figure 2:
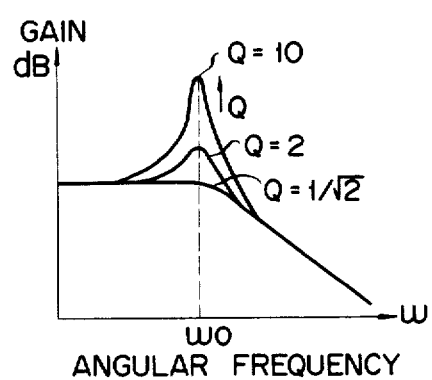
FIG. 2 is a graph showing a resonance characteristic of a low-pass filter.
Figure 4:
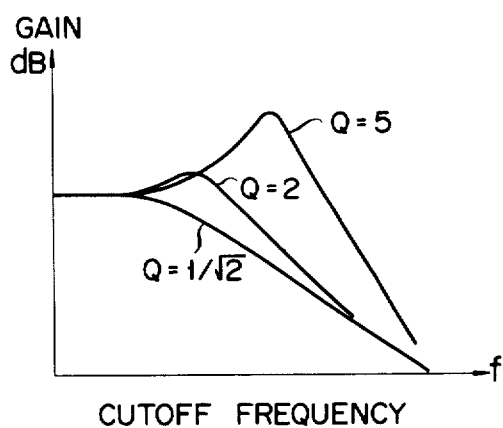
FIG. 4 is a view showing the change of the resonance frequency when the poles are moved along the imaginary axis as shown in FIG. 3.

Before describing the circuit configuration of the embodiment of the invention, a detailed description of the resonance characteristic will be made.

From the transfer function of the standard low-pass filter as expressed by equation (1), the transfer function of a low-pass filter having a resonance angular frequency of $\omega 0$ may be obtained as $$HL(S) = \frac{\omega 0}{S^2 + \frac{\sqrt{2}}{Q} \omega 0 S + \omega 0^2} \quad (3)$$

When the bilinear Z-transform is applied to this transfer function, we obtain $$H(Z) = \frac{K(1 + Z^{-1})^2}{1 + b1Z^{-1} + b2Z^{-2}} \qquad (4)$$

where the respective coefficients are expressed as $$b1 = \frac{2\omega 0^2 - \frac{8}{Ts^2}}{\omega 0^2 + \frac{2\sqrt{2}\,\omega 0}{QTs} + \frac{4}{Ts^2}} \qquad (5)$$

$$b2 = \frac{\omega 0^2 - \frac{2\sqrt{2}\,\omega 0}{QTs} + \frac{4}{Ts^2}}{\omega 0^2 + \frac{2\sqrt{2}\,\omega 0}{QTs} + \frac{4}{Ts^2}} \qquad (6)$$

$$K = \frac{\omega 0^2}{\omega 0^2 + \frac{2\sqrt{2}\,\omega 0}{QTs} + \frac{4}{Ts^2}} \qquad (7)$$

when $Q=1$ and the following substitutions are made in equations (5) to (7) above, $$A = \tan\left(\frac{\omega 0 Ts}{2}\right) \qquad (8)$$

$$B = 1 + \sqrt{2A + A^2} \qquad (9)$$

we obtain $$b1 = 2(A^2 - 1)/B \qquad (10)$$

$$b2 = \left(1 - \sqrt{2}\,A + A^2\right)/B \qquad (11)$$

$$K = A^2/B \qquad (12)$$

where Ts denotes a sampling time.

Therefore, the poles may be obtained from equation (4) as $$Z = -\frac{b1}{2} \pm j\frac{\sqrt{4b2 - b1^2}}{2} \qquad (13)$$

Figure 5:
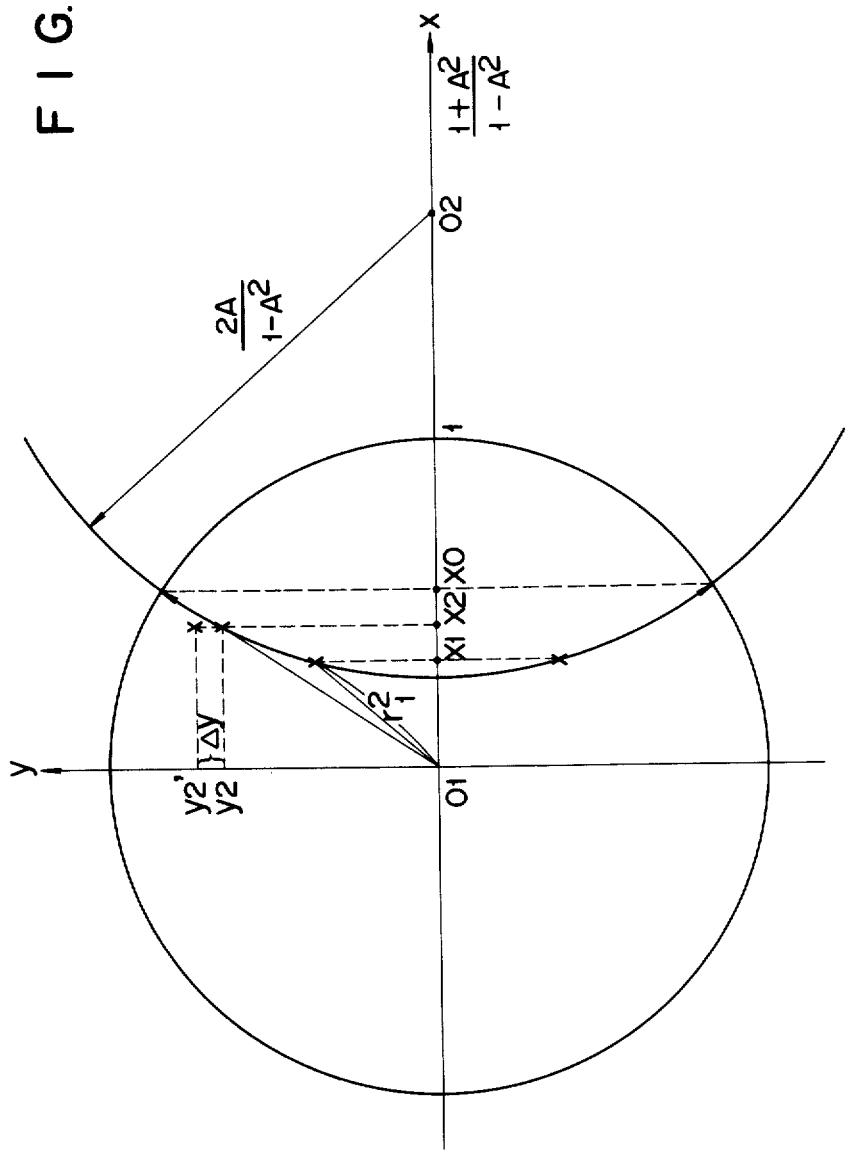
FIG. 5 is a view showing the movement of the poles of a digital low-pass filter according to one embodiment of the present invention.

These poles ($Q=1$) are represented by × marks in FIG. 5. FIG. 5 shows the Z-plane wherein the X-axis is the real axis, and the Y-axis is the imaginary axis. The positions of the poles may be expressed by $$x1 = -\frac{b1}{2} \qquad (14)$$

$$r1^2 = x1^2 + y1^2 \qquad (15)$$
$$= \frac{b1^2}{4} + \frac{4b2 - b1^2}{4}$$
$$= b2$$

where r is the distance between the origin and one of the poles (which is equal to the distance between the origin and the other pole). In other words, the respective coefficients b1 and b2 in the denominator of the transfer function expressed by equation (4) represent, respectively, the value of the real part of the complex number indicating the pole multiplied by −2, and the squared value of the distance between one pole and the origin. Thus, they may be expressed as $$b1 = -2x1 \qquad (16)$$

$$b2 = r1^2 \qquad (17)$$

The above description has been made with reference to the normal non-resonance condition, that is, when the resonance characteristic is not added. However, when the resonance characteristic is added, the two poles move along the Butterworth circle 02 as indicated by arrows.

This Butterworth circle 02 corresponds to a circle which connects the poles in the S-plane and the imaginary axis (FIG. 1) and is determined by the resonance angular frequency ω0. Thus, the center of this Butterworth circle 02 is $(1+A^2)/1-A^2$ and its radius is $2A/(1-A^2)$.

When the amplitude of the resonance is maximum, the poles approach the intersections of the Butterworth circle 02 with the unit circle 01. The X-coordinate x0 of these intersections may be expressed as $$x0 = \frac{1 - A^2}{1 + A^2} \qquad (18)$$

Therefore, as the amplitude of the resonance increases, the poles move from a position $(x, r^2) = (x1, r1^2)$ to a position $(x0, 1)$.

Figure 6:
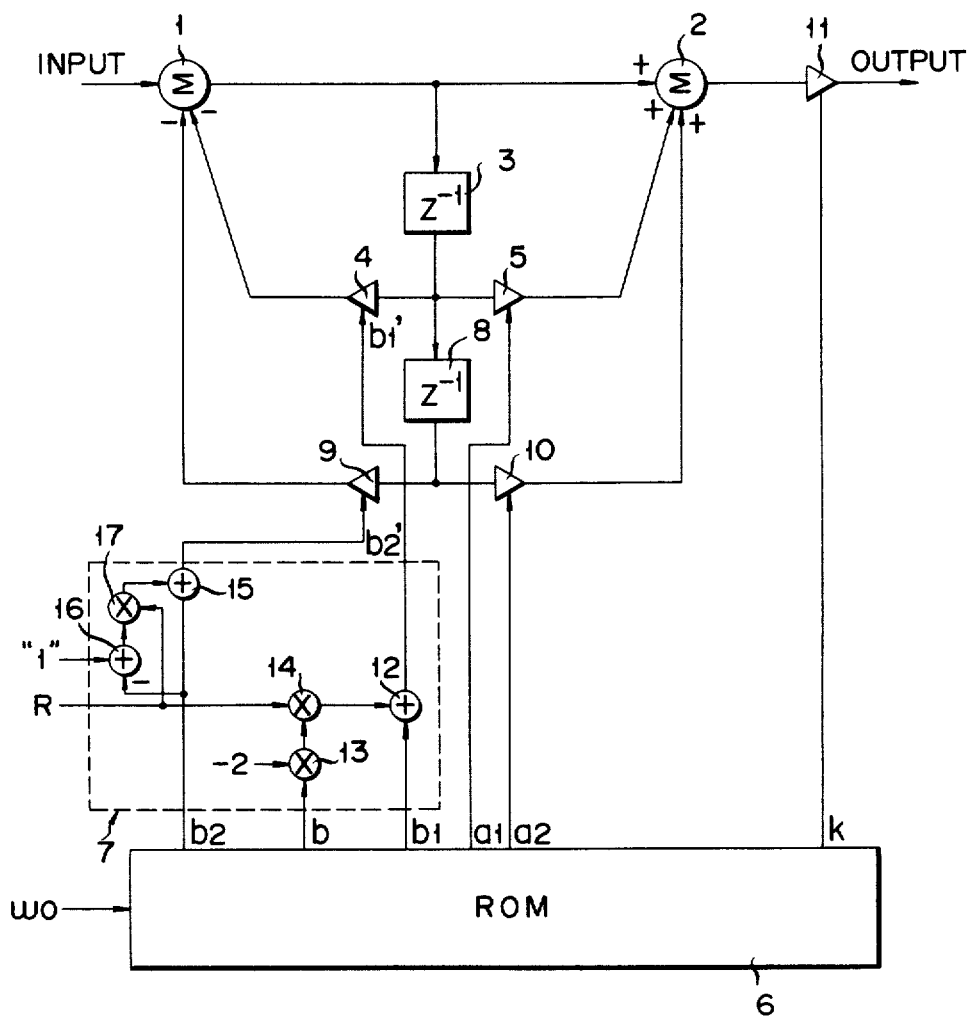
FIG. 6 shows a block diagram of a digital low-pass filter according to one embodiment of the invention.

The circuit configuration of this embodiment will be described. FIG. 6 shows the circuit configuration of this embodiment, including an adder 1 to which the input signal is supplied. The output of the adder 1 is supplied to an adder 2 and to a sampling time (Ts) delay circuit 3. The output of the delay circuit 3 is supplied to multipliers 4 and 5. To the multiplier 4 is also supplied a coefficient b1′ which is obtained by reading out the coefficient b1 from a ROM 6 when the resonance angular frequency ω0 is supplied to the ROM 6, and converting the coefficient b1 into the coefficient b1′ in an arithmetic circuit 7 according to data R representing the resonance amplitude. The input signal to the multiplier 4 is thus multiplied by the coefficient b1′, and the multiplication product is supplied to the adder 1. The data R representing the resonance amplitude may take a value between 0 and 1; it designates the normal filter when $R = 0$, and the filter having a resonance characteristic of maximum amplitude when $R \approx 1$. The signal supplied to the adder 1 from the multiplier 4, is subtracted from the input signal to the adder 1.

A coefficient a1 is supplied from the ROM 6 to the multiplier 5. However, since the transfer function of the present digital filter apparatus is given by equation (4) in this case, the multiplier 5 simply doubles its input data and outputs the result. The output of a delay circuit 8 to which the output of the delay circuit 3 is supplied, and which delays the sampling time (Ts), is supplied to the adder 1 through a multiplier 9 and to the adder 2 through a multiplier 10. To the multiplier 9 is supplied a coefficient b2′ which is obtained by reading out the coefficient b2 from the ROM 6 when the resonance angular frequency ω0 is supplied to the ROM 6, and converting the coefficient b2 in the arithmetic circuit 7 to the coefficient b2′ according to the data R representing the resonance amplitude. The input to the multiplier 9 is thus multiplied by the coefficient b2′, and the multiplication product is supplied to the adder 1. This signal to the adder 1 also instructs it to perform subtraction.

A coefficient a2 is supplied from the ROM 6 to the multiplier 10. However, since the transfer function is represented by equation (4) in this case, the coefficient a2 is 1 so that the multiplier 10 simply outputs its input data (after multiplication by 1) to the adder 2.

The output of the adder 2, to which adder are supplied for addition the outputs of the adder 1 and the multipliers 5 and 10, is supplied to a multiplier 11 to which is supplied the coefficient K from the ROM 6. The input signal to the multiplier 11 is thus multiplied by K, and the multiplication product is obtained as the output signal.

The mode of operation of the arithmetic circuit 7 will now be described. To the arithmetic circuit 7 are supplied the coefficients b1 and b2 as well as data b, from the ROM 6. The data b is the value $(x0 - x1)$ as shown in FIG. 5. This value is the difference between the X-coordinate of the poles when the resonance amplitude is at maximum and the X-coordinate of the poles when the resonance characteristic is not added.

The coefficient b1 is supplied to an adder 12 where it is added to the value $-2(x0-x1) \cdot R$ which is obtained by multiplying the data b by $-2$ at a multiplier 13 and then by R at a multiplier 14. Thus, data b1' is provided. If the value $-2(x0-x1)$ is outputted from the ROM 6, the multiplier 13 can be eliminated.

The data b1' may thus be expressed by equation (19) below, utilizing equation (16)

$$b1' = -2x1 - 2(x0 - x1) \cdot R \quad (19)$$

Therefore, the value of data b1' becomes equal to $-2x1$ when $R=0$ (under non-resonance condition), and it becomes equal to $-2x0$ when $R \approx 1$ (under the maximum resonance condition).

The coefficient b2 read out from the ROM 6 is supplied to an adder 15 as well as to an adder 16. At the adder 16, the coefficient b2 is subtracted. Data "1" is also supplied to the adder 16 so that the value $(1-b2)$ is outputted from the adder 16. The resultant data is supplied to a multiplier 17 where it is multiplied by R, and the multiplication product is supplied to the adder 15. The coefficient b2' outputted from the adder 15 may thus be expressed by $$b2' = b2 + (1 - b2) \cdot R \quad (20)$$
$$= r1^2 + (1 - r1^2) \cdot R$$

The coefficient b2' becomes equal to $r1^2$ when $R=0$ (under non-resonance condition) and becomes equal to 1 when $R \approx 1$ (under the maximum resonance condition).

With the embodiment of the construction described above, when the resonance angular frequency $\omega 0$ is supplied to the ROM 6, the coefficient data corresponding to the supplied resonance angular frequency $\omega 0$ is read out and is supplied to the corresponding arithmetic circuit. Since the data R is 0 under the non-resonance condition, the coefficients b1' and b2' outputted from the arithmetic circuit 7 respectively become b1 $(= -2x1)$ and b2 $(= r1^2)$. That is, these coefficients b1' and b2' are the coefficients b1 and b2 read out from the ROM 6. In this case, the poles on the Z-plane are at the positions marked by $\times$ (x1, $r1^2$) shown in FIG. 5.

Since the data R is such that $R \approx 1$ under the maximum resonance condition, the coefficients b1' and b2' outputted from the arithmetic circuit 7 respectively become $-2x0$ and 1. The poles on the Z-plane in this case are at the intersections (x0, 1) of the unit circle 01 and the Butterworth circle 02 in FIG. 5.

When the amplitude level at resonance is between the non-resonance condition $(R=0)$ and the maximum resonance condition $(R \approx 1)$, the poles on the Z-plane change along the Butterworth circle. The error of such movement will now be described.

When the data R takes a certain value (between 0 and 1), let it be assumed that the theoretical poles become $(x, y) = (x2, y2)$, and the poles of the digital filter apparatus of this embodiment become $(x2, y2')$. The error may then be obtained. The X-coordinate of the poles may be obtained as $$x2 = x1 + R(x0 - x1) \quad (21)$$

Since the theoretical poles (x2, y2) are on the Butterworth circle 02, they satisfy the following equation (22)

$$y2^2 = \left(\frac{2A}{1-A^2}\right)^2 - \left(x^2 - \frac{1+A^2}{1-A^2}\right)^2 \quad (22)$$

Since the distance between the point (x2, y2') and the origin 01 is $(1-r1^2) \cdot R + r1^2$ as may be seen from equation (20), we obtain $$y2'^2 = (1 - r1^2) \cdot R + r1^2 - x2^2 \quad (23)$$
$$= (1 - b2) \cdot R + b2 - x2^2$$

Consequently, the error may, for example, be obtained as $|y2^2 - y2'^2|$, and its value may be calculated to be about $10^{-6}$ to $10^{-10}$. Therefore, the error represented by $\Delta y \; (= y2' - y2)$ in FIG. 5 may be regarded as substantially zero.

Figure 7:
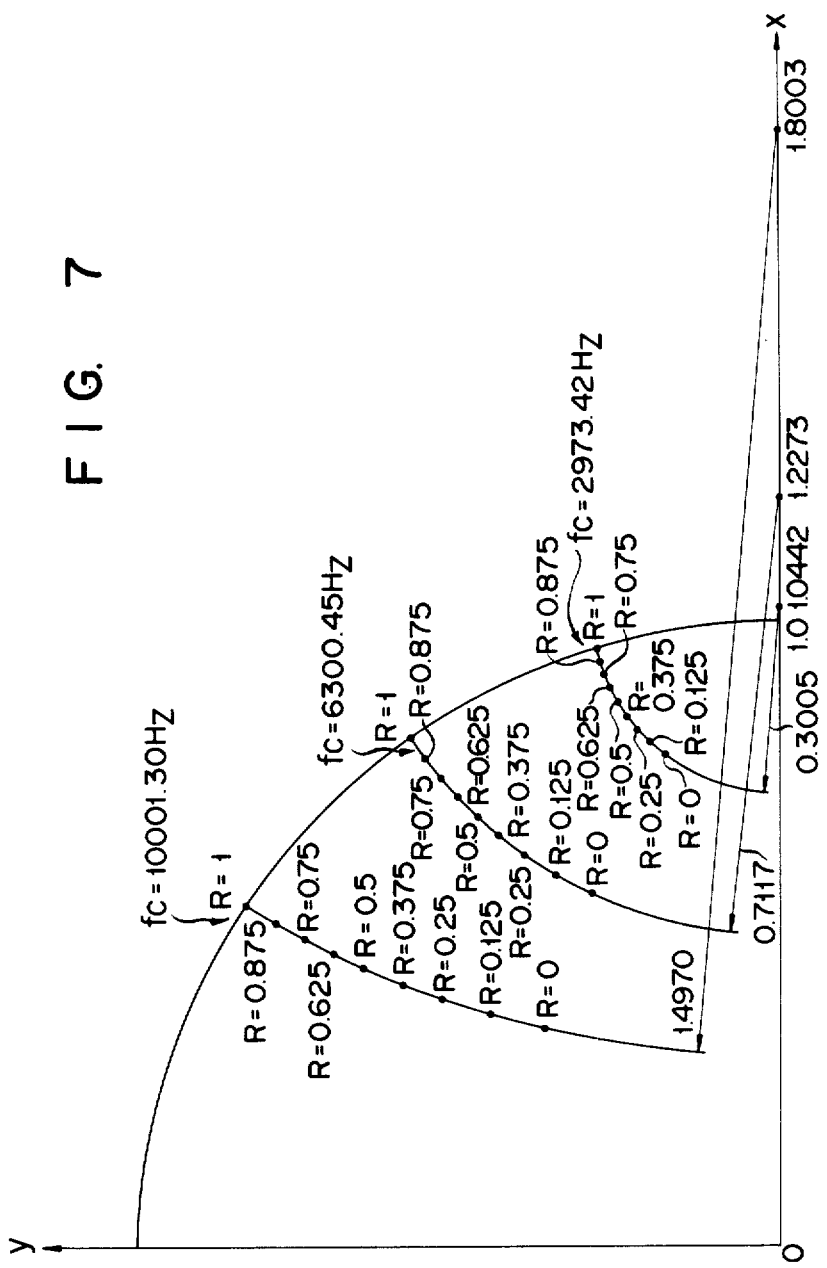
FIG. 7 is a view showing the movement of poles when the cutoff frequency is varied in the embodiment of FIG. 6.

Thus, according to the circuit configuration of this embodiment, it is seen that the poles move along the Butterworth circle 02 according to the change in the data R. FIG. 7 shows the movement of the poles in eight levels when the cutoff frequency fc is 2,973.42 Hz, 6,300.45 Hz, and 10,001.30 Hz and the sampling frequency fs $(=(1/Ts))$ is 64 kHz. It is seen that the poles move along the corresponding Butterworth circles.

In the present embodiment, the data to be stored in the ROM 6 for the respective resonance angular frequency $\omega 0$ are the coefficients b1, b2, b $(=x0-x1)$, a1, a2 and K. However, the data may be stored in other forms, and the coefficients to be used actually may be calculated.

The data R for determining the resonance amplitude may be the output (digital value) of an operating switch, or the value obtained by conversion of the output of the operating switch for increasing or decreasing as an index function.

In the disclosed embodiment, the present invention is applied to a low-pass filter arranged as a second-order Butterworth low-pass filter. However, the present invention is similarly applicable to a high-pass filter, a band-pass filter or those of high-order. In such a case, the coefficient whose value is to be increased or decreased may also be selected as required.

The present invention is capable of realizing a filter with many characteristics in a single circuitry which is easily applicable to a digital filter operating under a time-division basis for filtering multiple sound data. This is advantageous, for example, in realizing an electronic musical instrument such as a music synthesizer adapted to simultaneously generate many musical sounds for performing an ensemble.

What is claimed is:

1. A digital filter apparatus having a resonance characteristic, comprising:

digital filter means arranged to have a certain transfer function and including operation means for implementing the transfer function on an input signal and for providing a corresponding filter output signal;

first memory means for storing first data corresponding to poles of the transfer function of the digital filter means under a non-resonance amplitude condition;

second memory means for storing second data corresponding to poles of the transfer function of the digital filter means under a maximum resonance amplitude condition;

arithmetic means coupled to said first and said second memory means for calculating filter coefficients for the transfer function based on the first and the second data when read out from the first and the second memory means, said calculated filter coefficients varying between those obtained under the non-resonance amplitude condition and under the maximum resonance amplitude condition; and means for supplying said calculated filter coefficients to the operation means of said digital filter means so that said digital filter means realizes a peak in the amplitude characteristic of the transfer function of said digital filter means in accordance with said calculated filter coefficients.

2. A digital filter apparatus according to claim 1, wherein said arithmetic means is arranged to calculate the filter coefficients so that the poles of the transfer function of the digital filter means move along a Butterworth circle.

3. A digital filter apparatus according to claim 2, wherein said operation means of the digital filter means is arranged to filter a digital input signal in accordance with a transfer function H(Z) of the form:

$$H(Z) = \frac{K(1 + Z^{-1})^2}{1 + b1'Z^{-1} + b2'Z^{-2}};$$

and wherein the first data stored in said first memory means corresponds to coefficients b1 and b2 under the non-resonance amplitude condition, the second data stored in said second memory means corresponds to a coefficient b which determines the transfer coefficients under the maximum resonance amplitude condition, and said arithmetic means is arranged to calculate the transfer coefficients b1' and b2' according to the following equations $$b1' = b1 + (-2)b \cdot R$$

$$b2' = b2 + (1 - b2) \cdot R,$$

where the coefficient R determines a resonance level; and further comprising third memory means for storing the coefficient K.

4. A digital filter apparatus having a resonance characteristic, comprising:

digital filter means arranged to have a certain transfer function and including operation means for implementing the transfer function on an input signal and for providing a corresponding filtered output signal;

memory means for storing coefficients of the transfer function of the digital filter means under a non-resonance amplitude condition and control data which determines the coefficients under a maximum resonance amplitude condition;

means for delivering resonance level data which determines the resonance level of said digital filter means;

arithmetic means coupled to said memory means and to said resonance level data delivering means for calculating coefficients of the transfer function corresponding to the resonance level represented by the resonance level data; and means for supplying said calculated coefficients to the operation means of said digital filter means so that said digital filter means realizes a peak in the amplitude characteristic of the transfer function of said digital filter means, the level of said peak being determined by said resonance level data.

5. A digital filter apparatus according to claim 4, wherein said arithmetic means is arranged to calculate the transfer function coefficients so that the poles of the transfer function of the digital filter means move along a Butterworth circle.

6. A digital filter apparatus having a resonance characteristic, comprising:

memory means for storing coefficients b1, b2 and K for a transfer function H(Z), and for storing control data b, said coefficients b1 and b2 being coefficients under a non-resonance amplitude condition and said control data b serving to determine coefficients under a maximum resonance amplitude condition, and said transfer function being $$H(Z) = \frac{K(1 + Z^{-1})^2}{1 + b1Z^{-1} + b2Z^{-2}};$$

means for delivering a resonance level data R which determines a resonance level;

arithmetic means coupled to said memory means and to said resonance level data delivering means for calculating coefficients b1', b2' by using the coefficients b1, b2 and said control data b according to the following equations $$b1' = b1 + (-2)b \cdot R$$

$$b2' = b2 + (1 - b2) \cdot R;\text{ and}$$

digital filter means including operation means for implementing the transfer function on an input signal and for providing a corresponding filtered output signal, said operation means being coupled to receive said coefficient K from said memory means and to receive said coefficients b1', b2' from said arithmetic means, for filtering a digital input signal in accordance with said coefficients b1', b2' and K, and for outputting a signal having a peak in an amplitude characteristic thereof at a cutoff frequency.

7. A digital filter apparatus according to claim 6, wherein said arithmetic means is arranged to calculate the transfer function coefficients so that the poles of the transfer function of the digital filter means move along a Butterworth circle.

* * * * *